United States Patent
Boling

(10) Patent No.: US 6,402,902 B1
(45) Date of Patent: Jun. 11, 2002

(54) APPARATUS AND METHOD FOR A RELIABLE RETURN CURRENT PATH FOR SPUTTERING PROCESSES

(75) Inventor: Norman L. Boling, Santa Rosa, CA (US)

(73) Assignee: Deposition Sciences, Inc., Santa Rosa, CA (US)

(*) Notice: Subject to any disclaimer, the term of this patent is extended or adjusted under 35 U.S.C. 154(b) by 0 days.

(21) Appl. No.: 08/388,191

(22) Filed: Feb. 13, 1995

(51) Int. Cl.[7] .............................................. C23C 14/34
(52) U.S. Cl. ......................... 204/192.12; 204/298.23; 204/298.24; 204/298.25; 204/298.26
(58) Field of Search ...................... 204/192.12, 298.25, 204/298.23, 298.24, 298.26

(56) References Cited

U.S. PATENT DOCUMENTS

| | | | | |
|---|---|---|---|---|
| 4,630,568 A | * | 12/1986 | Kieser | 118/715 |
| 4,661,229 A | * | 4/1987 | Hemming et al. | 204/192.13 |
| 4,851,095 A | * | 7/1989 | Scobey et al. | 204/298.26 |
| 4,946,576 A | * | 8/1990 | Dietrick et al. | 204/298.23 |
| 5,122,252 A | * | 6/1992 | Latz et al. | 204/298.26 |
| 5,232,569 A | * | 8/1993 | Nelson et al. | 204/298.23 |
| 5,288,386 A | * | 2/1994 | Yanagi et al. | 204/298.26 |
| 5,616,224 A | * | 4/1997 | Boling | 204/298.08 |
| 5,849,162 A | * | 12/1998 | Bartolomei et al. | 204/192.13 |

* cited by examiner

Primary Examiner—Steven H. Versteeg
(74) Attorney, Agent, or Firm—Duane Morris LLP; D. Joseph English; L. Lawton Rogers, III

(57) ABSTRACT

A method for establishing and maintaining a reliable ground for reactive sputtering systems. A spatially extended high density plasma is generated in a large region surrounding the sputtering target. The plasma electrically connects the target to a part of the coating machine that is not subject to deposition of sputtered material from the target. The plasma is generated by an applicator which is independent of the target.

21 Claims, 5 Drawing Sheets

APPARATUS AND METHOD FOR A RELIABLE RETURN CURRENT PATH FOR SPUTTERING PROCESSES

TECHNICAL FIELD OF THE INVENTION

This invention is a device for improving the effectiveness of and reducing the cost of any process of the type known to the art as reactive sputtering when the process requires that a low resistance conducting path for the target power supply be maintained for its duration, and when an insulating film on the substrate is created by the process. The target power supply may be a DC supply or it may be an AC supply which operates at a frequency that is too low to allow capacitive coupling to provide a current return to ground.

BACKGROUND OF THE INVENTION

DC or low frequency AC sputtering is often preferable to sputtering using an RF supply (RF sputtering). Higher sputtering rates are achievable and power supplies are simpler as well as cheaper. RF sputtering presents difficulties when large targets are employed so that the electromagnetic wavelength at the frequency of operation (normally 13.56 MHz) becomes comparable to the size of the target. In such cases standing waves cause hot spots and instabilities leading to coating inhomogeneity and nonuniformity. Standing waves are, of course, not present in DC or low frequency AC sputtering.

As practiced by the prior art, however, reactive DC or low frequency AC sputtering processes have been subject to instability caused by a phenomenon which has become known to the art as the "disappearing anode". For reasons which will now be stated, the present invention prevents the disappearing anode phenomenon from occurring, thereby enhancing the stability of the processes.

A typical DC sputtering apparatus consists of a sputtering target located in a vacuum vessel along with a substrate upon which sputtered material is to be deposited. The atmosphere in the chamber contains a sputtering gas, usually argon, at an appropriately low pressure. When the process is operating, the sputtering power supply is connected between the target and the chamber walls causing a plasma to be formed in the chamber. The target is the cathode. In a region adjacent to the target called the sheath, a voltage drop that is, in the absence of a voltage drop in the plasma, roughly equal to the power supply voltage (typically 500 volts) occurs, and in this region ions of the sputtering gas are accelerated toward the target. When these ions strike the target they cause the metal which forms the target, such as silicon or titanium, to be sputtered from the target surface into the space between the target and the substrate. The atoms then travel through this space on trajectories which may involve many collisions until they strike some surface and become attached to it. A buildup of sputtered material on the substrate and on other surfaces in the vicinity of the target and substrate begins. The (non-insulating) sputtered material then reacts with a gas such as oxygen that has been introduced into the chamber, forming the coating that is desired for the substrate, which is an insulating material such as silicon dioxide or titanium dioxide, on all surfaces which have been coated with sputtered material.

In some reactive sputtering processes, the sputtering gas and the reactive gas are the same. Such processes function in the same way as has just been described, except that since only one species of gas such as oxygen is introduced into the chamber, ions of this species sputter metal from the target, and activated forms of the same species subsequently react with the sputtered metal on the substrate surface.

The positively charged ions that strike the target bring about a net flow of positive charge from the plasma in the chamber to the target. This flow of charge to the target must be balanced by an equal transfer of charge by electrons traveling from the plasma to the chamber walls or other grounded conductors to form the return path for the target power supply current. As is well known, under conditions of low current, the bulk plasma exists in a region of relatively constant potential, called the plasma potential. In the presence of electric current, there is a potential gradient in the bulk plasma which is proportional to the current density and inversely proportional to the density of charge carriers at each point in the plasma.

The potential gradient, measured in volts/cm, results in a voltage drop across the bulk plasma between the target and the chamber walls, and power is dissipated within the plasma in proportion to the product of the target current by the voltage drop in the plasma. This power is obtained at the expense of power being consumed in sustaining the intense ionization at the target. If the plasma is physically extended, voltage gradients within it are insufficient to cause a compensating ionization in the bulk plasma. Therefore, a voltage drop within the plasma decreases the amount of power supply energy that is available for ionization and consequently results in a decrease in electron density within the plasma. Since the density decrease causes a further increase in the voltage drop, the process tends to go out of control when the plasma density in the region through which the electric current must pass becomes low enough to cause the voltage drop across the plasma to become a significant portion of the power supply voltage. Under such conditions instabilities or complete plasma shutdown may occur.

An unacceptably large voltage drop within the plasma inevitably occurs in a reactive DC or low frequency reactive sputtering process due to restriction of the current flow by the progressive formation of insulating material on the conductors near the target. An initial buildup of insulating material on the conducting surfaces near the target causes the area of the walls available for electron current flow to decrease and to move farther away from the target. The region of plasma in which current must flow to find a path to ground therefore moves further away from the target so as to contact uncoated sections of wall. This forces the current to take a longer path through a region which is farther away from the region of plasma generation and where the plasma is consequently less dense. Furthermore, blockage of the current path reduces the area of the chamber walls which is accessible to the return current, so that the cross sectional area of the current flow is reduced, and, if the ion current to the target is kept constant, the current density increases. The voltage gradient in the bulk plasma, which is proportional to the current density and inversely proportional to the plasma density, is increased by both these factors. This increase in the gradient eventually brings about a voltage drop across the plasma which is a substantial fraction of the supply voltage causing the above-mentioned instability or shutdown of the plasma.

In most DC or low frequency AC sputtering processes as practice by the current art, a magnetic field is introduced into the region of the plasma that is adjacent the target. The rate of generation of ions of the sputtering gas in the region above the target is thereby increased over that which would be achieved without the magnetic field, which then brings about a corresponding increase in sputtering rate and the sputtering plasma which must pass through the plasma. Processes which employ such magnetic fields are called magnetron sputtering processes. The adverse affects of the oxide buildup which are mitigated by the present invention exist whether or not the process is a magnetron process.

The effect of the voltage drop across the plasma can be compensated to some extent by continuously adjusting the voltage of the target power supply so as to maintain a constant target current for the duration of the process. This approach has the disadvantages that a power supply of considerably greater capacity and complexity is required and that a considerable portion of the power is dissipated in the gas within the chamber, wasting power and causing undesirable heating.

For the above reasons the buildup of insulator and corresponding voltage drop across the plasma during the sputtering process requires that the process be interrupted after a certain amount of material has been deposited to allow cleaning or replacement of parts that are close to the sputtering target. The result is that such processes are more costly and provide lower rates of production of coated parts than a process in which such cleaning or replacement would not be required.

It is therefore an objective of this invention to provide an environment within the sputtering chamber during a DC or low frequency AC sputtering process in which a relatively constant low resistance current path to ground is maintained for a period of time whose duration greatly exceeds that provided by current art.

It is a further objective of this invention to improve the stability of such a process by providing a source of plasma within a sputtering chamber that is separate from the target power supply and which therefore can be maintained in a spatially uniform condition throughout a large volume of the chamber for the duration of the process while allowing the target voltage and current to remain fixed.

SUMMARY OF THE INVENTION

The invention is a device for performing an operation known to the art as reactive DC sputtering or reactive low frequency AC sputtering. It may be employed in a batch process which employs a rotating apparatus such as a drum within a chamber or in a continuous process such as a roll coater or in-line coater. At least one wide area plasma applicator produces a plasma having a required electron density and uniformity within a region such that a current can flow through the plasma from the sputtering target to portions of the grounded walls of the sputtering chamber that are remote from the target.

The plasma generated by the applicator diffuses into the region where sputtering is taking place where it commingles with the plasma of the sputtering process. The plasma also diffuses into regions which are remote from the sputtering region where it makes contact with the walls of the sputtering chamber and with other grounded conductors. In these remote regions there is no oxide formation so that electron current can freely flow to the walls or other conducting objects. The applicator causes a current path through the combined plasmas from the target to the chamber walls to exist, so that the chamber walls or other conducting objects remote from the sputtering process and not subject to insulator formation can serve as the anode. Thus the invention assures the presence of a reliable current path to ground during the sputtering process.

The portion of the plasma which commingles with the plasma generated by the DC target potential causes the electron temperature and the ion and electron density in the sputtering region to attain a level that is higher than the level which they would reach if the applicator were not present.

The aforesaid higher densities bring about a corresponding enrichment of the densities of reactive species at the surface of the substrate. The density of reactive species remains stable and high during the entire process and is not influenced by the formation of insulating material on nearby surfaces. Thus control of the reaction process at the substrate surface is provided throughout the process.

DETAILED DESCRIPTION OF THE INVENTION

Figure 1:
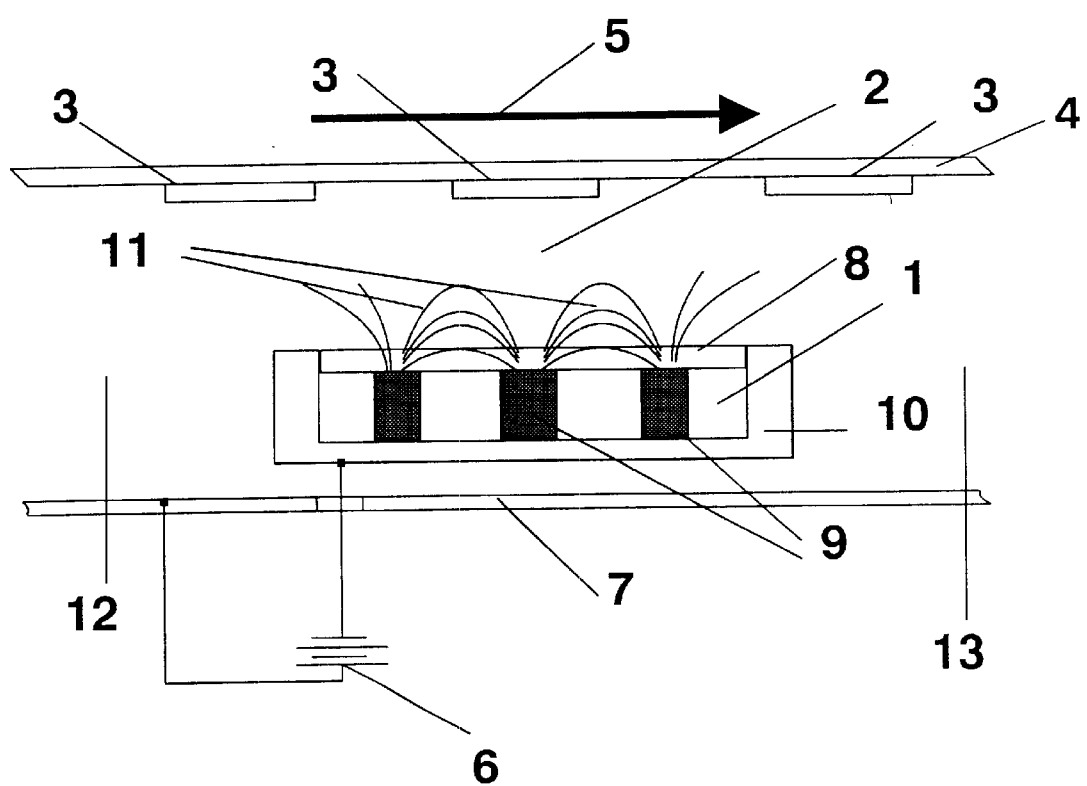
FIG. 1 is a section through the apparatus that is essential to a reactive DC or low frequency AC sputtering process, showing how the present invention overcomes the deficiencies of the prior art.

FIG. 1 is a section through the basic components that are required in a reactive sputtering process. A sputtering target assembly 1 is situated in a chamber volume 2 which contains a reactive gas such as oxygen or nitrogen and a sputtering gas, such as argon at low pressure. A plurality of substrates 3 are transported be a device 4 such as a rotating drum, a belt or a web in the direction of arrow 5. The sputtering power supply 6 is connected between the chamber wall 7 and the target with its negative terminal connected to the target.

The sputtering target assembly consists of the target, which is a plate 8 comprised of the material that is to be sputtered, a magnet pack 9 and a base 10. In plan view the assembly is typically rectangular and the magnet pack typically takes the form of an elongated racetrack. Magnetic field lines 11 emanate from the poles of the magnet pack and some of them enter the region of the sheath.

When the target power supply is first turned on, argon ions in the sheath above the target are accelerated by the electric field in the sheath and strike the target, causing material to be sputtered from the target and also releasing secondary electrons. In the region where the magnetic field lines enter the sheath, the secondary electrons do not travel in the direction of the electric field, but instead follow a trajectory such that their average velocity is perpendicular to the plane of the figure. In plan view their trajectories follow the plan of the magnet pack. As they travel, they suffer inelastic collisions with neutral argon atoms and ionize them. The newly-created ions are in turn accelerated to the target, creating more sputtered material and secondary electrons and renewing the process. An intense plasma forms in the volume adjacent to the target which contains the magnetic field, and the production rate of ions is much higher than in other regions. Ion flow from this intense plasma to the target and the rate of sputtering from the target as well as the current flowing through the target greatly exceed levels that would be realized if the magnetic field were not present.

Atoms of sputtered material travel away from the target, suffering collisions with the atoms of gas within the chamber before being deposited on some surface within the chamber. Once deposited, they react with the reactive gas in the chamber to form an insulating layer of oxide or nitride on the same surfaces. Thus an insulating layer builds up on the surfaces of the chamber which are most accessible to the diffusion of sputtered material from the target.

The plasma, which must carry the return current to the chamber walls, originates mainly in the high intensity zone above the target. It also moves from this zone by a process known as ambipolar diffusion, following much the same path as that portion of the sputtered material which undergoes collisions before arriving at a surface. When it reaches the walls of the chamber, recombination of electrons and ions occurs so that the plasma is consumed at a rate that depends on its density. Under conditions such that the electrical configuration within the chamber is not changing with time, the plasma density at any point in the chamber reaches a steady state condition. In such a steady state condition, the plasma density will not change in time but will decrease with distance from the sputtering source in a manner that is similar to the decrease in the concentration of sputtered atoms.

In an actual reactive sputtering process, conditions do change with time. As the process continues, an insulating layer builds up on those surfaces where the plasma is most dense, forcing the return current to take a longer and constricted path through regions of less dense plasma. Since the voltage drop across the plasma is proportional to the length of the path and inversely proportional to the plasma density, this process leads to a steadily increasing voltage drop in the plasma. Eventually, the voltage drop increases to a value at which, for reasons stated earlier, instability or shutdown of the process occurs.

The present invention involves a device for reactive sputtering which includes a chamber capable of maintaining a vacuum and accepting and maintaining a sputter gas and gas reactive with a sputtered material. A target is also located within the chamber together with at least one substrate positioned with respect to the target capable of being coated by sputtered material from the target. A reliable current path is established between the target and an uncoated portion of the chamber wall in the form of a plasma having a minimum density of free electrons of at least $1.2 \times 10^{10}$ cm$^{-3}$ which fills the volume between the target and uncoated chamber wall. This plasma is created by at least one plasma generator operable independent of the target voltage.

As noted above, in the practice of the present invention, a plasma is generated in at least one of the regions 12 and 13 of FIG. 1 by providing at least one separate plasma applicator which generates a plasma in a large volume adjacent to it. The applicator is located in the chamber in such a way that the plasma that it generates occupies the region of current flow between the target and the chamber walls.

An essential feature of this invention is that the required plasma density and volume must be sufficiently high to allow current to flow from the target to a portion of the chamber wall that is sufficiently remote from the target that it remains free of insulator buildup. The required plasma density for typical industrial processes will now be estimated for a drum coating machine, a small in-line coating machine, a roll coater and a large in-line coater.

The sputtering power supply voltage will be assumed to have a typical value of 500 volts. A voltage drop within the bulk plasma generated by this invention which has a value greater than about ten percent of the total supply voltage is known on the basis of prior experience and the considerations introduced previously to be unacceptable. Setting this value, 50 volts, as the maximum allowable voltage drop across the plasma, an upper limit on the resistivity, ρ, of the plasma that is generated by this invention is calculated using the formula $$\rho = \Delta V \times A / L \times I$$

where ΔV, A, L, and I are respectively the values of the maximum allowable voltage drop, the cross sectional area of a section of the plasma taken perpendicular to the flow of current, the length of the current path and the current in the plasma. The current I is assumed to be proportional to the length of the target, which is the same as the width of the plasma volume, with a proportionality constant of 0.4 amp/cm for the drum, small in-line and roll coaters, and 0.55 amp/cm for the large in-line coater.

Assuming that the electron temperature in the plasma and the mean free path for electrons within the chamber have typical values of 4 electron-volts and 1 cm, respectively, the plasma electron density $n_e$ is calculated using the formula $$n_e = m_e \times v / \rho \times q^2$$

where $m_e$ is electronic mass, q is the electronic charge and v is the frequency of collisions between the electrons and neutral atoms in the plasma generated by the current invention. This collision frequency is calculated by taking the ratio of the average electron velocity to the mean free path of the electrons. The electron velocity is calculated from $$v^2 = 8 \times k \times T / \pi \times m_e$$

where k=Boltzmann's constant.

Required plasma densities are calculated for different types of industrial coaters. The following discussion applies to the case of a drum coater and illustrates how the calculations are set up for a particular geometry. In such a coater an oxide buildup is observed on the chamber walls over a region which extends roughly 60 cm from the target in the direction parallel to the motion of the drum surface. The distance transverse to the motion of the surface over which substrates are to be treated is also 60 cm and the distance from the drum to the chamber wall is 10 cm. To reach an uninsulated section of wall, charge must travel through a distance of 60 cm along a path whose area is 60 ×10 cm, which will cause a voltage drop to occur across the plasma in that region. Using previously described assumptions and conditions within the chamber, the value $8 \times 10^{10}$/cm$^3$ for the required average electron (or ion) density in the plasma is calculated.

Table I gives the required densities and volumes that have been calculated for different types of coaters. These required densities and volumes far exceed the densities and volumes that exist in coaters of similar type which did not employ the current invention.

TABLE I

REQUIRED VOLUMES AND DENSITIES OF PLASMAS GENERATED BY THE PRESENT INVENTION

| TYPE | CURRENT (amp) | LENGTH OF CURRENT PATH (L cm) | AREA OF CURRENT PATH (A cm$^2$) | REQUIRED VOLUME (cm$^3$) | REQUIRED PLASMA DENSITY (cm$^{-3}$) |
|---|---|---|---|---|---|
| DRUM | 24 | 60 | 600 | $3.6 \times 10^4$ | $2.0 \times 10^{10}$ |
| INLINE (SMALL) | 24 | 60 | 1000 | $6 \times 10^4$ | $1.2 \times 10^{10}$ |
| ROLL | 32 | 80 | 1000 | $8 \times 10^4$ | $2.1 \times 10^{10}$ |
| IN LINE (LARGE) | 165 | 100 | 4500 | $4.5 \times 10^4$ | $5.9 \times 10^{10}$ |

The requirements listed in Table I are included for illustrative purposes only and should not be taken as a specific requirement for any actual coating machine. They serve to illustrate the general range of average plasma densities and volumes that must be provided by any embodiment of the present invention. It is to be emphasized, that in all cases shown in Table I, the plasma density is required to be in excess of a value between 1.2 $\times 10^{10}$ within the volumes indicated in column 5. It is a novel feature of the present invention that it creates a plasma which in each case meets the average density requirements of column 6 within the indicated volumes.

To achieve a plasma having the required properties, the invention employs a wide area applicator in close proximity to the target to create a plasma in a large volume surrounding the target and substrates. The plasma produced by this applicator has a higher density and volume than has previously been used in a sputtering process. The physical configuration of components is such that the plasma extends into regions where the walls are inaccessible to material which has been sputtered from the target and will therefore not be subject to buildup of an insulating layer. The plasma makes contact with the walls or other grounded conductors in these regions, providing a current path to ground through these conductors. Thus the conductors provide the anode for the process, which endures throughout the duration of the process.

Figure 2:
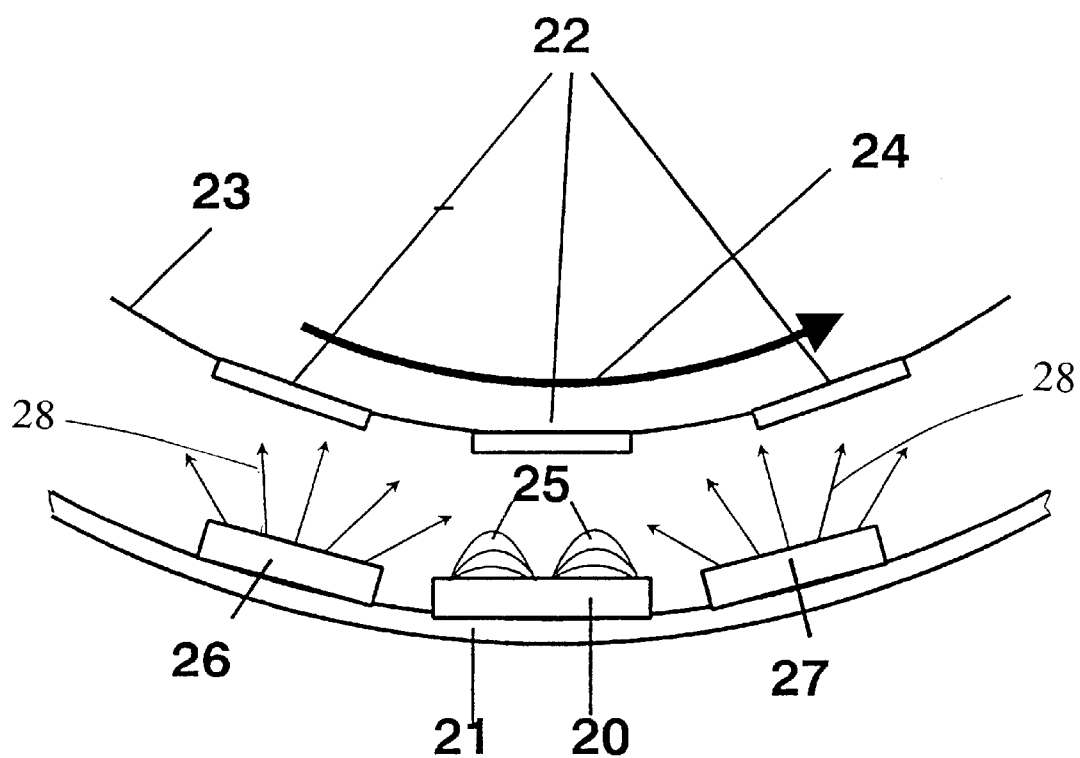
FIG. 2 is a cross sectional view of an embodiment of the invention as used in a drum coater in which a plasmaguide applicator is employed.

FIG. 2 shows a section view of the main physical components of an embodiment of the invention in which it is used in a drum coater. The sputtering target assembly 20 with its case grounded and the target connected to the cathode of the power supply, not shown, is mounted on the wall 21 of the coating chamber. Substrates 22 are conveyed by a rotating drum 23 in the direction of the arrow 24 so that they pass over the target assembly. Magnetic field lines 25 extend above the surface of the target and cause an intense plasma to exist in the region of the magnetic field. Plasma and sputtered material travel outward from this region and the sputtered material accumulates on the substrates and other surfaces in the chamber.

At least one large area microwave activated plasma applicator such as is described in U.S. patent application Ser. No. 08/371,195 filed on Jan. 11, 1995, issued as U.S. Pat. No. 5,714,009, the disclosure of which is incorporated by reference, hereafter referred to as plasmaguide applicator, is mounted on the chamber wall so as to be adjacent to the target assembly. Two such applicators 26, 27 are shown in FIG. 2 by the outline of their sections. When driven by microwaves, each applicator has the property that it causes a plasma to be ignited along one of its surfaces which contacts the gas in the chamber. Due to the principle of operation of the applicator, the density of the plasma at the generating surface must be sufficient to cause microwave energy in the applicator to be reflected back into the applicator at this surface, which for the usual microwave frequency of 2.45 Ghz implies that the density must exceed approximately $7.5 \times 10^{10}$ electrons/cm$^3$. The plasma density may be further increased above this value by increasing the level of microwave power that is used to drive the applicator. In some embodiments the applicator may employ a configuration of magnets, such as magnet pack, which is installed adjacent to it on the outside of the chamber. The applicator creates a magnetic field of a strength necessary to cause the occurrence of a phenomenon known as electron cyclotron resonance (ECR) in the volume adjacent to the interior surface of the applicator. By this means a substantial increase in the intensity of the plasma in the volume containing the magnetic field is achieved.

The shape of the large area applicator in a particular embodiment may be chosen from a variety of available shapes so that it is appropriate to that embodiment. In the present embodiment, an elongated shape is desirable, with the axis of elongation extending perpendicular to the plane of the paper. The length of the device, which was assumed to be 60 cm when preparing Table I, is substantially the same as the width of the area on the drum, also extending into the paper, over which substrates are to be coated. Plasma is generated at the surface of the applicator which faces the drum and diffuses outward in the direction of the arrows 28 into an extended region on either side of the target. The plasma also commingles with the plasma generated in the magnetic field adjacent to the target, to generate a plasma having a density in excess of that required in Table I for a drum coater, so that the required conducting path between the target and regions of the chamber walls at a required distance from the target (60 cm was assumed in preparing Table I) is provided.

The volume within which a given density of plasma is maintained can be extended indefinitely by using a plurality of similar applicators that are mounted on the chamber walls adjacent to one another with their long axes parallel to the axes of those shown in FIG. 2.

The presence of the applicators has an additional benefit beyond that of providing a reliable current path to ground. The gaseous medium at the plasma-generating surface of the applicator contains a reactive gas such as diatomic oxygen or nitrogen which is transformed into an activated state, such as a monatomic form, mainly in the region near this surface. Molecules or atoms of the activated species then diffuse outward toward the coated substrate where they react with the deposited material.

Referring again to FIG. 2, as the substrates travel past the applicator 26 on the left side of the figure and continue past the target and finally past the applicator 27, they continually receive a deposit of sputtered material which diffuses from the target. The presence of the additional applicators provides a continual abundant supply of activated atoms at the surface of the substrates during the entire time of transit, assuring that a complete reaction occurs on the substrate surfaces.

Figure 3:
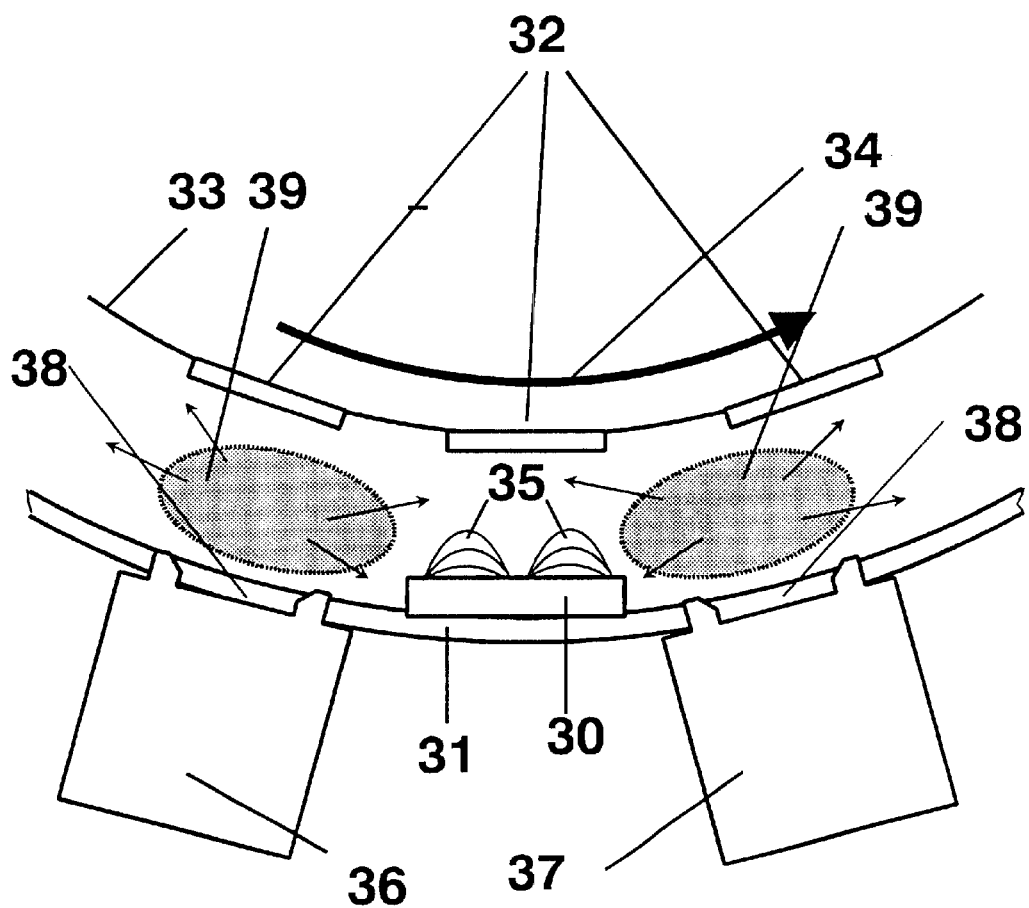
FIG. 3 is a cross sectional view of an embodiment of the invention as used in a drum coater in which a microwave activated plasma applicator as taught in U.S. Pat. No. 4,630,568 is employed.

The invention consists of the use of any type of applicator capable of providing a plasma having the required density and volume for the purpose of providing a reliable ground. FIG. 3 shows an embodiment in which the applicator is based on an invention by Kieser disclosed in U.S. Pat. No. 4,630,568, the disclosure of which is hereby incorporated by reference. This type of applicator will be referred as a traveling wave applicator. In FIG. 3 the same drum coater configuration that was shown in FIG. 2 is illustrated. FIG. 3 shows a sputtering target 30 with magnetic field lines 35, a portion of the chamber wall 31, and substrates 32 being transported by a rotating drum 33 in the direction of the arrow 34. The microwave applicators 36 and 37, shown only in outline, are different from those of FIG. 2 in that they employ the traveling wave applicator as taught by Kieser. This type of applicator contains within it an elongated traveling wave structure and hence will be called a traveling wave applicator. The traveling wave structure, not shown, has its longitudinal axis situated so as to be perpendicular to the plane of the figure. An elongated window which is penetrable by microwaves and is part of the applicator has its outer surface 38 parallel to the long axis of the traveling wave structure and also to the motion of the substrates at points above the center of the window. When this structure is driven by microwaves, a strong, oscillating electromagnetic field generated by the applicator extends through the window into the regions 39 of the volume which lie between the surface of the window and the substrate. The strong field creates an intense plasma in this region which then diffuses outward into the surrounding regions of the chamber. As in the embodiment of FIG. 2, the plasma commingles with the plasma generated by the sputtering target and also fills the extended regions extending away from the target on either side, thereby providing the required current path for the sputtering process.

Figure 4:
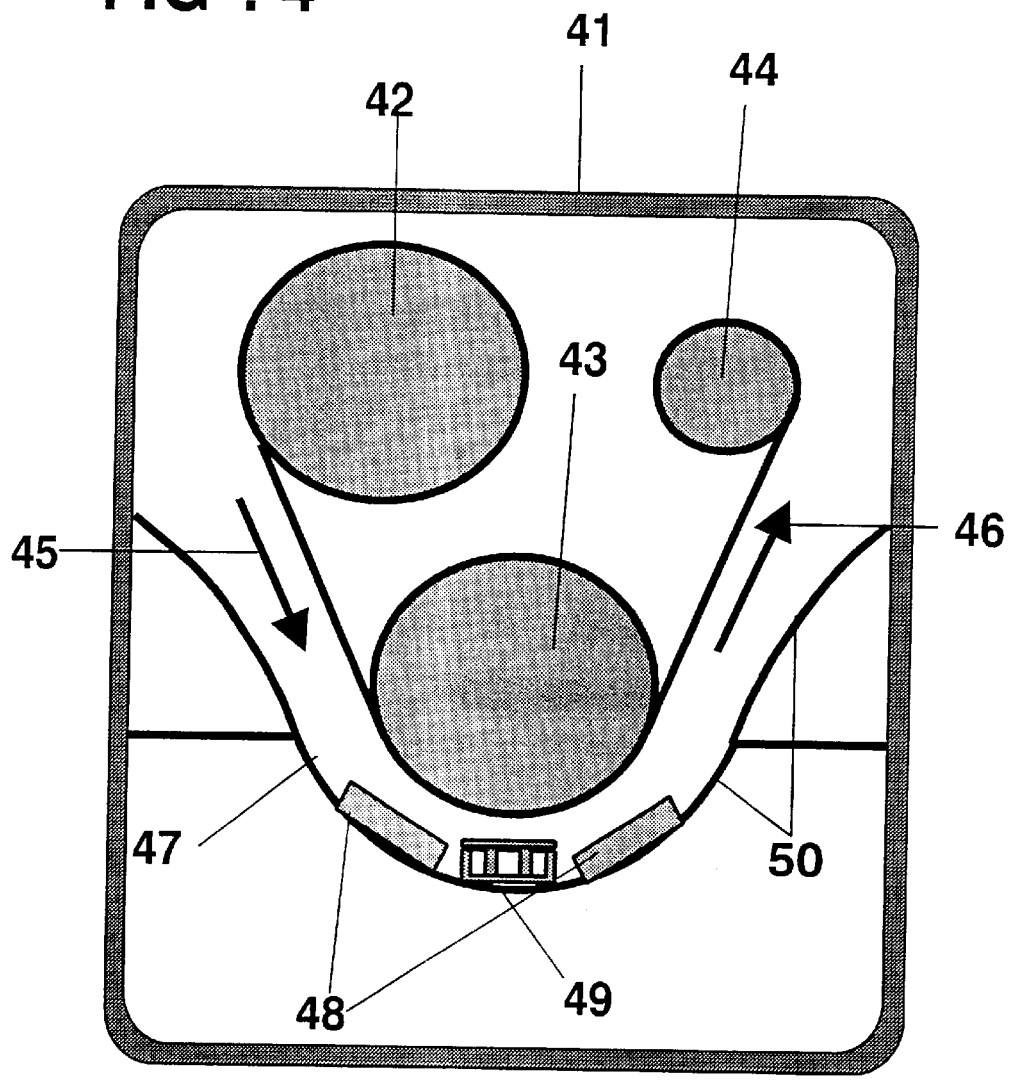
FIG. 4 is a section of an embodiment of the invention which is used in a roll coating process.

FIG. 4 shows an embodiment of the invention in which it is being used in a roll coating process. The substrate, which is a belt of flexible material that has been taken from spool 42 within the vacuum chamber 41 moves in the direction of the arrows 45 and 46 so as to contact the guide roller 43. As the substrate moves on the guide roller it passes over the plasma applicators 48 which are situated on either side of the target 49, receiving the desired coating. After being coated, the substrate is stored on the takeup spool 44. As in previous embodiments the chamber wall is grounded and plasma from the applicators, the density of which exceeds the value given for the roll coater in Table I, fills the region on both sides of the target, providing a reliable current path to ground. In FIG. 4, a supporting structure 47 and 50 made of conducting material and mechanically and electrically connected to the walls, confines the plasma and facilitates the passage of current.

Figure 5:
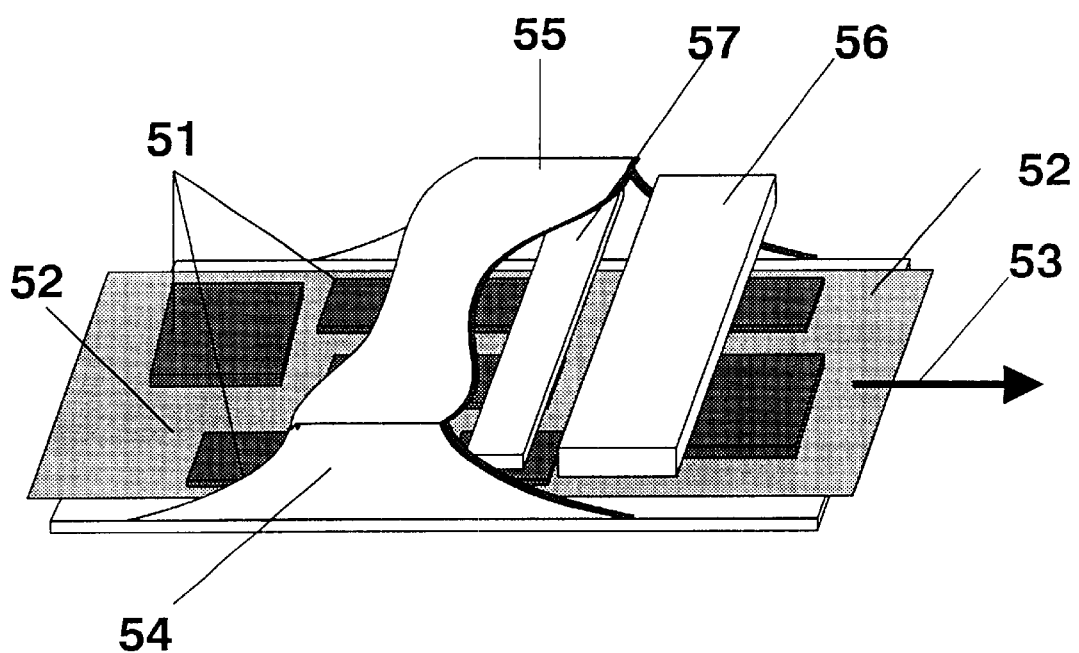
FIG. 5 is a perspective of an embodiment of the invention as used in a large in line coater in which a plasmaguide plasma applicator is employed.

FIG. 5 shows an embodiment in which the current invention is employed with a large, in-line coating chamber such as is used in the manufacture of coated plate glass for architectural windows. In this embodiment the substrates are large compared to those of other embodiments, necessitating a large chamber and a large volume of plasma which must be generated by the applicators. This embodiment corresponds to the large in-line coater of table I in which the width of the coating chamber was taken as three meters and the depth was 15 cm. Some in line coaters are considerably larger than the example of Table I. In such large in line coaters it may be desirable to use a plurality of plasma applicators. In FIG. 5, substrates, 51 shown as large, rectangular sheets of glass or other material, are shown being transported on a moving device 52 with a flat surface, such as a belt or web so as to move in the direction of the arrow 53.

The walls 54 and top 55 of the coating chamber are shown cut away in order to provide a view of the sputtering target 56 and the plasma guide applicator 57. The applicators and the sputtering targets are shown as elongated rectangular parallelepipeds and have their long axes parallel. As the substrates travel under the plasmaguide applicators and the sputtering targets, they receive a coating which subsequently reacts with an active form of the reactant gas which has been introduced into the chamber. As in previous embodiments, the plasma generated by the applicators, the density of which exceeds the value given in Table I for a large in-line coater, provides a conducting path capable of carrying current to points on the chamber walls which are remote from the sputtering targets, thereby greatly extending the amount of substrate material that can be processed before it becomes necessary to renew the current path to ground by cleaning the coating machine.

The embodiments of FIGS. 2, 3, 4, and 5 are examples of configurations that are compatible with commonly used types of coating machines. These configurations used the plasmaguide applicator made the subject of U.S. patent application Ser. No. 08/371,195 filed on Jan. 11, 1995 and assigned to the owner of the present application, issued as U.S. Pat. No. 5,714,009, the disclosure of which is incorporated by reference, and a traveling wave applicator which is covered by U.S. Pat. No. 4,630,568. The physical shape and dimensions of these devices can be altered to meet desired operating requirements. The plasmaguide applicator, for example, can be provided in the form of a long rectangular wave guide, whose cross section can be altered to provide a device that is suitable for a given type of machine. The dimension in the direction perpendicular to the surface where the plasma is generated can be made small to facilitate introduction of a magnetic field by magnets mounted on the opposite face of the applicator. Also, plasmaguide applicators may be fabricated that have a surface for plasma generation that is a circle. Such applicators may take the shape of a right circular cylinder in which the height of the cylinder is kept small in order to allow the aforementioned introduction of a magnetic field. The present invention includes the use of any applicator configuration that is provided for the purpose of supplying required plasma density in a region through which anode current passes to ground, regardless of whether a plurality of activators or a single applicator is used. It also includes the use of applicators with or without an associated magnetic field and applicators having any physical shape or physical dimensions.

It is a significant feature of this invention that it allows generation of a plasma in a sputtering process by a method which is nearly independent of the sputtering action. Thus the plasma properties, such as uniformity, electron density, electron temperature, density of excited reactive species, and volume can be altered to meet the requirements of a given process of a particular target and chamber configuration. Such tailoring of the plasma characteristics is achieved by selecting on optimal applicator configuration and adjusting the microwave power supplied to the applicator. This is an advancement over prior art in which the characteristics of the plasma generated in a DC process were determined exclusively by the mechanical and electrical configuration of the target and the chamber. Considering the earlier discussion of FIG. 1 once more, it is noted that in a reactive sputtering process as conducted according to prior art, the region containing the plasma was initially confined to a small region between the target and the drum. During the process the plasma changed in an uncontrolled manner.

In the embodiment of the invention shown in FIGS. 2, 3, 4, and 5, on the other hand, a large portion of the energy to sustain the plasma is supplied by the applicator so that variations in conditions existing in the sputtering process do not significantly affect the plasma. To illustrate, we point out that a plasma would exist in the vicinity of the substrate in the embodiment of FIGS. 2, 3, 4, and 5 even if the DC supply to the target were turned off. The invention generates a plasma whose properties are not strongly altered by changes in chamber geometry, for example, by rotation of the drum, or by changes in the electrical configuration, such as a change in the electrical path to ground. It thus provides a means for maintaining conditions required for achieving a desired result, such as proper stoichiometry of a deposited film.

In addition to providing a plasma environment that is insensitive to changes within the chamber, the invention provides a means for controlling the environment without changing the sputtering rate. Such control is not achievable with prior art. The density, temperature and spatial distribution of the plasma can be controlled by changing the microwave power entering the applicators. Furthermore, the volume of the plasma can be extended indefinitely by using a plurality of applicators. Thus, at a given sputtering rate, the conditions to which sputtered material is exposed can be controlled to achieve a desired result.

I claim:

1. A reactive sputtering device being comprised of a chamber capable of maintaining a vacuum and accepting and maintaining a sputter gas and a gas reactive with sputtered material, a target of conductive material to be sputtered, a means of applying a DC target voltage between the target and said chamber, a source of sputtering gas and reactive gas located proximate said target, at least one substrate positioned with respect to said target in such a manner as to be capable of being coated by sputtered material from the target and a plasma generator located proximate said target for converting said reactive gas to a plasma, said plasma being capable of reacting with said sputtered material on said substrate to convert said sputtered material to a chemical species more insulative than target material wherein said plasma generator is capable of providing a reliable current path from the target to an uncoated conducting part of said chamber remote from said target in the form of a plasma, said plasma having at least a portion thereof with a density of free electrons of at least $1.2 \times 10^{10}$ per cubic centimeter which extends between said target and said uncoated part of said chamber, said plasma being created by at least said plasma generator which operates independent of the target voltage.

2. The device of claim 1 in which the sputtering gas and the reactive gas comprise the same species.

3. The device of claim 1 wherein said plasma is formed within said chamber by use of microwave power directed through a plasmaguide applicator.

4. The device of claim 1 wherein said at least one substrate is mounted upon a drum which rotates and moves said at least one substrate past said target material.

5. The device of claim 4 wherein said drum is not grounded so that substantially no current flows through the drum during operation of said device.

6. The device of claim 1 wherein means for providing a magnetic field are positioned proximate said target.

7. The device of claim 1 wherein said substrate comprises a continuous strip of material.

8. The device of claim 1 wherein said substrate comprises a continuous strip of substrate material fed from a roll of substrate material.

9. The device of claim 1 wherein said plasma is formed by use of a traveling wave applicator.

10. A method for forming a layer of sputtered material onto a substrate while maintaining a reliable current path from a sputter target to an uncoated conducting part of a sputter chamber, said method comprising maintaining a vacuum within said chamber, delivering and maintaining a sputter gas and gas reactive with a sputtered material proximate a target of conductive material to be sputtered, applying a DC target voltage between a target and said chamber, providing at least one substrate positioned with respect to said target so as to coat said substrate with sputtered material from said target, providing a plasma generator located proximate said target, said plasma generator converting said reactive gas to plasma, said plasma thereupon reacting with said sputtered material on said substrate to convert said sputtered material to a different chemical species more insulative than said target material, providing a reliable current path from the target to an uncoated conducting part of said chamber remote from said target in the form of a plasma, said plasma having at least a portion thereof with a density of free electrons of at least $1.2 \times 10^{10}$ per cubic centimeter extending between said target and said uncoated part of said chamber, said plasma being created by at least said plasma generator operating independent of said target voltage.

11. In a reactive sputtering device comprising a sputtering chamber, a sputter target positioned within said chamber, a plasma generator positioned within said chamber proximate said sputter target, a substrate carrier positioned within said chamber and spaced from said sputter target so that at least some of the material sputtered from said target will deposit on a substrate carried thereby, and a return current portion of said chamber spaced from said target so that essentially no material sputtered from said target will deposit on said portion;

a return current path between said target and said return current portion comprising a plasma generated by said plasma generator having a free electron density of at least $1.2 \times 10^{10}$ per cubic centimeter.

12. The reactive sputtering device of claim 11 wherein said substrate carrier comprises a substantially cylindrical mounting surface.

13. The reactive sputtering device of claim 11 wherein said substrate carrier comprises a substantially planar mounting surface.

14. In a reactive sputter device comprising a sputtering chamber and a sputter target positioned within the chamber having a voltage potential therebetween, a method of providing a current path between the target and a portion of the chamber sufficiently spaced from the target so that essentially no material sputtered from the target is deposited on the portion, said method comprising the step of generating a plasma having an electron density of at least $1.2 \times 10^{10}$ per cubic centimeter extending between the target and the portion to thereby provide the current path therebetween.

15. The method of claim 14 wherein said plasma is generated by a plasmaguide applicator.

16. The method of claim 14 wherein said plasma is generated by a traveling wave applicator.

17. A sputtering device comprising:

a sputtering chamber;

a sputtering target positioned within said chamber;

means for applying a voltage between said target and said chamber;

a plasma generator positioned within said chamber for generating a plasma from a reactive gas contained within said chamber, said plasma having an electron density sufficient to provide a current path between said target and a return current portion of said chamber spaced farther from said target than said plasma generator.

18. The sputtering device of claim 17 wherein the electron density of the plasma providing the current path is at least $1.2 \times 10^{10}$ per cubic centimeter.

19. The sputtering device of claim 17 wherein the voltage applied between said target and said chamber is ac voltage.

20. The sputtering device of claim 17 wherein the voltage applied between said target and said chamber is a low frequency ac voltage.

21. The sputtering device of claim 17 wherein the return current portion of said chamber is sufficiently spaced from said target so that said portion remains essentially free from sputtered material deposited thereon.

* * * * *